United States Patent [19]

Hobbs et al.

[11] Patent Number: 4,885,481

[45] Date of Patent: Dec. 5, 1989

[54] CONFIGURABLE MEMORY ADDRESS DECODER FOR INTEGRATED MEMORY CIRCUITS WITH AUXILIARY MEMORY LOCATIONS

[75] Inventors: James B. Hobbs, Minneapolis; Jeffrey P. Graebel, Maple Grove, both of Minn.

[73] Assignee: Honeywell Inc., Minneapolis, Minn.

[21] Appl. No.: 209,147

[22] Filed: Jun. 17, 1988

[51] Int. Cl.$^4$ ............... H03K 19/013; H03K 19/086; H03K 17/04; H03K 19/007
[52] U.S. Cl. ..................... 307/463; 307/202.1; 307/442; 307/299.2; 365/189.08; 365/230.08
[58] Field of Search ............ 307/442, 202.1, 449, 307/463, 441, 465, 455, 299.2; 365/289.08, 230.08

[56] References Cited

U.S. PATENT DOCUMENTS

| | | | |
|---|---|---|---|
| 4,125,784 | 11/1978 | Harrison | 307/442 |
| 4,425,517 | 1/1984 | Smith | 307/442 X |
| 4,583,205 | 4/1986 | Watanabe | 307/463 X |
| 4,613,774 | 9/1986 | Mazumder | 307/463 |
| 4,689,494 | 8/1987 | Chen et al. | 307/202.1 |
| 4,721,868 | 1/1988 | Cornell et al. | 307/463 X |
| 4,812,677 | 3/1989 | Perry | 307/442 X |
| 4,829,481 | 5/1989 | Johnson et al. | 307/202.1 X |

Primary Examiner—Stanley D. Miller
Assistant Examiner—David R. Bertelson
Attorney, Agent, or Firm—W. T. Udseth

[57] ABSTRACT

The improvement of the present invention provides configurable selection circuitry, which may be used to substitute auxiliary memory locations into a matrix memory. The configurable selection circuitry, after configuration, operates in response to selected signals to drive an auxiliary memory location while disabling the memory location formerly driven by the selected signals.

15 Claims, 1 Drawing Sheet

CONFIGURABLE MEMORY ADDRESS DECODER FOR INTEGRATED MEMORY CIRCUITS WITH AUXILIARY MEMORY LOCATIONS

The United States Government has rights in this invention pursuant to Contract No. F33615-84-C-1500, awarded by the United States Air Force.

BACKGROUND OF THE INVENTION

1. Field of the Invention.

The present invention relates to decoding circuits employed with memory arrays and more particularly to decoding circuits for use in integrated circuits comprising memory arrays with a surplus of rows of memory cells which may be substituted for rows of memory cells which do not operate properly.

2. Description of the Prior Art.

A manufacturer of integrated circuits may often reduce overall manufacturing costs of its product by reducing the rejection rate for defective individual parts. One way to reduce the rejection rate is through ever finer refinement of manufacturing processes. Such refinement, though, is subject to the laws of diminishing returns. For example, a given integrated circuit may contain several thousand individual electronic components, such as transistors, diodes and the like. It may prove relatively easy and inexpensive to reduce the probability of a particular integrated circuit having one or more defective components to a certain percentage but increasingly difficult or expensive to improve the rejection rate beyond that point. Still, the presence of only one or two defective components out of thousands of components on an integrated circuit will dictate the rejection of that integrated circuit and potentially thousands of other integrated circuits.

Another solution to reducing the rejection rate, without expensive refinements of manufacturing processes, is to provide auxiliary, sometimes called redundant, circuit components on the integrated circuit. This solution is practical where testing can locate, within certain bounds, the defective component, and the circuit is readily reconfigurable to allow substitution of an auxiliary component for the defective component. Integrated circuit matrix memory arrays, including static random access memories, are such circuits.

Memory arrays are characterized by the regular repetition of components. A very substantial portion of an integrated memory array is taken up by substantially identical memory cells disposed in regular rows and columns.

Decoding circuits are provided on the integrated circuit memory for operating on various combinations of electrical signals provided as inputs to the integrated circuit to generate signals within the integrated circuit for causing activation of a specific group of cells in the array. The decoder circuit includes a plurality of row decoders, each of which is adapted to provide a row select signal in response to a particular known set of electrical signals.

The foregoing combinations of electrical signals typically comprise sets of logic signals. A logic signal is an electrical signal which represents two states, termed 0 and 1. Each logic signal represents a selected one of these states by being set at a certain predetermined voltage level, for example Vo for 1. Another voltage level may then be taken as 0. Typically, the voltage level for logical 1 is higher (i.e., more positive) than the voltage level for logical 0. Each logic signal represents one bit of information.

While combinations of logic signals may be provided to integrated circuits in various ways, one common way, seen in digital computers, is to provide a separate conductive path for each logic signal. Different combinations, by virtue of activating different rows of memory cells through the decoder, represent what are called memory addresses. A particular row of cells actuated is the memory address location. Each memory address is defined by the same number of logic signals.

A computer will address a memory address location in a time segment known as a memory cycle. Accordingly, one set of conductive paths, known as address lines, provides for transmission of all memory addresses. The set of address lines is referred to as the address bus. One memory address appears on the address bus in each memory cycle.

The repetitive nature and "addressable" characteristics of integrated circuit array memories are the aspects of these integrated circuits which are exploited to substitute auxiliary components. Because one row of memory cells is substantially like another row of memory cells, it does not matter which row stores any particular information. What matters is that it does store it and that the information can be located thereafter.

Substitution of auxiliary components for regular components requires reconfiguration of the circuit so that a memory address causes activation of a previously unused row of memory cells and ceases to cause activation of the defective row.

In certain static random access memories, row decoders incorporate integrated NPN-type bipolar multi-emitter transistors. Memory row select signals are generated on the collectors thereof in response to the transistor being in its off state. Control of the ON/OFF state of each multi-emitter transistor is effected through control of the voltage potential appearing on each emitter thereof. If a voltage difference between any emitter and the base of the transistor exceed the threshold voltage for the transistor, the transistor turns on. Only if the threshold potential is not exceeded between any base to emitter junction is the transistor off. Accordingly, providing high signals to all of the emitters of a multi-emitter transistor in a row decoder is required to turn the transistor off.

The potential level on each emitter of the multi-emitter transistor is transmitted thereto on actuation lines. One actuation line is provided for each state of each address signal. Thus, there are two actuation lines for each address line, a primary actuation line which is high when the signal on the address line represents logic 1 and low otherwise, and a complementary actuation line which is high when the signal on the address line represents logic 0 and low otherwise. One emitter from each of the multi-emitter transistors for one-half of the row decoders is electrically connected to the primary actuation line corresponding to a given address line. One emitter from each of the multi-emitter transistors in all of the remaining row decoders is electrically connected to the complementary actuation line corresponding to the same address line. Accordingly, half the multi-emitter transistors will have a high potential appearing on one emitter for any memory address. This pattern is repeated for each address line. One-half of the multi-emitter transistors have an emitter connected to the primary actuation line for an address line, the other half have one emitter connected to the complementary actuation line for the address line. However, connection of the actuation lines is done so that no two row drivers are connected to the same combination of actuation lines. Only one row decoder will receive all high signals on all the emitters of its multi-emitter transistor for any one memory address. That row decoder generates a row select signal in response to its multi-emitter transistor turning off.

The electrically conductive paths supplying power to each row decoder, and the electrically conductive paths corresponding to the actuation lines, can be caused to lie on the surface of the integrated circuit and thus be accessible for reconfiguration. In prior art devices, both conductive paths are configured to achieve circuit reconfiguration.

Reconfiguration is achieved by incorporating an element, such as a fusible link, in a surface conductive path on the integrated circuit. Such fusible links, or configuration links, may be opened by a variety of steps, e.g., exposure to laser light to vaporize the link. Opening a link breaks the electrical connection between, for example, one element and the balance of the circuit. Opening a configuration link is used to remove a portion of a circuit element, or a substantial collection of elements, from the overall circuit.

In certain prior art devices, configuration links are used to connect each row decoder to a power source. Opening the configuration link for a particular row decoder prevents that row decoder from developing a select signal. Auxiliary row decoders for each auxiliary row of memory cells are provided. Each auxiliary row decoder has a multi-emitter bipolar NPN transistor and is substantially similar to regular row decoders. However, the number of emitters in the auxiliary multi-emitter transistor equals the total number of actuation lines. Each emitter is connected to one actuation line by a configuration link. As long as all the configuration links are closed, one-half of the emitters will be low for each address and no select signal is generated. The auxiliary decoder generates an auxiliary memory row select signal only after one half of the configuration links connected to its emitters are opened, leaving a pattern of closed configuration links corresponding to a memory address.

In order to provide for substitution of auxiliary rows of memory cells into the matrix memory, the number of configuration links provided equals $2^n + 2nK$ (where n equals the number of address lines and K equals the number of auxiliary rows of memory cells). While configuration links can be made quite small, they do occupy valuable space on the surface of the integrated circuit. Further, configuration links for row decoders and those disposed on actuation lines are located in different parts of the integrated circuit, introducing complications in reconfiguration of the circuit. An additional problem with such prior art devices is excessive variation in voltage levels on terminals where select signals are to be generated. Select signal voltages vary as a function of the number of auxiliary decoders programmed. Because actuation signals are generated by current sources, programming reduces the number of emitters from which current is drawn thus producing more sharply defined select signals. In devices with a large number of auxiliary decoders, it sometimes proves necessary to program a certain minimum number of auxiliary decoders whether needed or not.

SUMMARY OF THE INVENTION

The present invention provides an improved configurable decoding circuit for array memories, particularly static random access memories. The decoding circuit comprises an actuation system, including primary and complementary actuation lines corresponding to each address line. The decoding circuit further includes a plurality of regular row decoders coupled to selected actuation lines so that a particular row decoder generates a memory row select signal in response to receipt by the decoding circuit of a particular memory address. In addition, the decoding circuit includes at least a first auxiliary row decoder. The decoder has configurable selection circuits, which include configuration links, for actuating the auxiliary row drivers and for generating a cancel select signal for transmission to all regular row decoders.

The actuation system responds to input memory addresses for developing actuation signals. As in the prior art, two actuation lines are associated with each address line, the primary actuation line carrying a high signal in response to a logic 1 state address signal, the complementary actuation line transmitting a high signal in response to a logic 0 state address signal. A specific bit of a memory address for a memory location is either logic 1 or logic 0.

Memory locations are embodied in rows of memory cells in a memory array. A row of memory cells is selected, for purposes of being read or written into, by an individual row decoder. Each regular row decoder is electrically connected to its own unique combination of one-half of the actuation lines so that a given row decoder develops a row select signal in response to exactly one address. Each row decoder includes one NPN bipolar multi-emitter transistor. Electrical connection of a row decoder to its respective actuation lines is by way of the emitters of the multi-emitter transistor. Direction to the row decoder to generate a select signal is effected by transmitting a high potential level signal to each of the emitters of the multi-emitter transistor. Thus one memory address will turn the transistor off, allowing generation of a select signal. Unlike the prior art, the multi-emitter transistors of the row decoders of the present decoding circuit include an emitter other than those connected to the actuation lines. The additional emitter is electrically connected to a cancel select transmission line allowing the multi-emitter transistor to be turned on, cancelling the select signal, notwithstanding the appearance of all high level signals on the emitters connected to the actuation lines. The provision of the additional emitter and its connection to the cancel select line allows deletion of the fusible links by which the prior art allows removal of row decoders from the circuit.

The auxiliary row decoders provide select signals to the drivers for auxiliary rows of memory cells of the memory array. Each auxiliary row decoder comprises a conventional single emitter bipolar transistor which may be turned on and off by control of the voltage level appearing on its emitter. The on or off state of the bipolar transistor determines whether a select signal is generated by the auxiliary decoder. The single emitter is electrically connected to a configurable selection circuit, which controls the emitter voltage level.

A configurable selection circuit is provided for each auxiliary row decoder. When a configurable selection circuit is configured to replace a defective row, its outputs will change for the unique address corresponding to the defective row. For this combination of address inputs, the bipolar transistor in the auxiliary decoder controlled by that configurable selection circuit will be turned off, generating a row select signal for the auxiliary row. For this unique address, each configurable selection circuit is further adapted to cause a low level signal to appear on the cancel select transmission line for cancelling generation of row select signals by the regular row decoders. An unconfigured configurable selection circuit provides essentially steady outputs to its auxiliary row decoder and the cancel select transmission line. The auxiliary row decoder generates no row select signal and has no effect on the cancel select line.

In one embodiment, the configurable selection circuit comprises a plurality of NPN bipolar transistor switches, each being connected at its base to a different one of the actuation lines. Each transistor switch, when on, provides an electrical path between the auxiliary row decoder and a current source. The electrical connection between the auxiliary row decoder and the configurable selection circuit is made at the emitter of the auxiliary row decoder transistor. Connection of the emitter to the current source via a single selection switch transistor is sufficient to keep the transistor on and the row select signal low. Each transistor switch is serially connected with a configuration link which may be opened to render its respective transistor switch inoperable. Absent opening of one-half of the configuration links, at least one transistor switch will connect the auxiliary row decoder to the current source for any memory address and the output to the auxiliary row decoder will remain a low level steady state signal. Similarly, the cancel select line remains high (inactive). However, where exactly half of the configurable links are opened, one memory address exists which breaks electrical contact between the auxiliary row decoder and the current source. The auxiliary row decoder will thereupon generate a row select signal. Simultaneously, the cancel select line will go low, preventing any regular row decoder multi-emitter transistor from being turned off and thus selecting a memory row.

Accordingly, each additional auxiliary row of memory cells in the present invention requires provision of a set of configuration links equal in number to the total number of actuation lines. The prior art requires not only these configuration links but an additional configuration link associated with each regular row driver. Thus, for K auxiliary rows of memory in an array with n address lines, a prior art device would have $2^n + 2nK$ configuration links. The present invention typically requires only 2nK configurable links. In a system providing for 8 row address lines and 6 auxiliary rows of memory cells, a prior art device requires 352 configuration links, the present invention only 96. Because configuration links occupy valuable space on the surface of an integrated circuit, such a reduction is very valuable.

Further, in prior art devices, actuation lines are coupled to the auxiliary row decoder multi-emitter transistor emitters through configuration links. Current drawn from each emitter attached to the actuation line becomes a function of the number of configuration links opened. Accordingly, voltage level variations appear from regular row decoders, as function of the configuration of the decoder. Transitions could appear as select signals from the row decoders. The present invention electrically isolates the configuration links from the actuation lines, and thus the number of emitters from which an actuation line draws current remains constant for all memory addresses.

DETAILED DESCRIPTION OF THE PREFERRED EMBODIMENT

Figure 1:
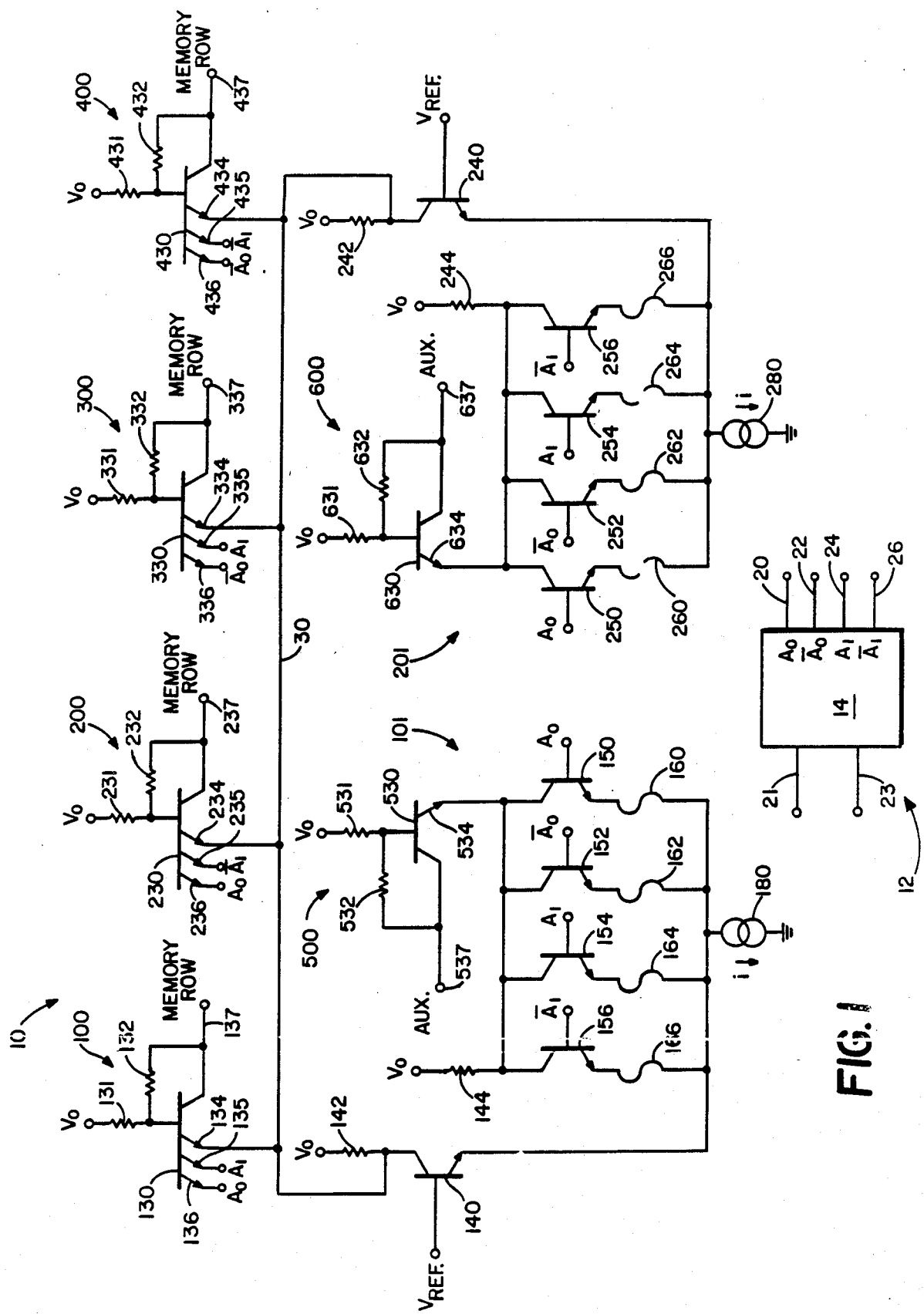
FIG. 1 is a circuit schematic of an embodiment of an improved configurable decoder for a memory array in accordance with the present invention.

The single figure illustrates a circuit schematic of a preferred embodiment of the invention. For purposes of example only, it is assumed that decoding circuit 10 will be used in conjunction with a memory array (not shown) in a static random access memory comprising six rows of memory cells. It is further assumed that decoding circuit 10 is employed in a computer which addresses four memory locations, herein rows of memory cells in the memory array. Thus, the computer includes a two line address bus 12, shown in exemplary form and without connections being explicit. Bus 12 can transmit to decoder 10 all possible memory addresses employed to identify memory locations useable by the computer. All such memory addresses are two bit signals, $A_0 A_1$. Address line 21 carries address bit $A_0$ and address line 23 carries address bit $A_1$.

Decoder 10 incorporates an actuation subsystem 14. Actuation subsystem 14 provides at least one logic high or positive output for each possible state of an address bit. Put another way, address bit $A_0$ can assume two states, logic 1 or logic 0. Similarly, address bit $A_1$ can assume two logic states, logic 1 or logic 0. Actuation subsystem 14 provides actuation outputs $A_0$ and $A_1$ which are high to reflect logic 1 state address bits $A_0$ and $A_1$. Actuation outputs $A_0$ and $A_1$ appear on actuation lines 20 and 24, respectively. Actuation subsystem 14 also provides logic signal complements. When address bit $A_0$ is logic 0, actuation system 14 produces a high signal $A_0'$ on actuation line 22. Similarly, address line 23 transmits $A_1'$, a logic complement signal on actuation line 26. (In the figure, these signals are indicated with a bar rather than a prime). For memory address binary 11 actuation signals $A_0$ and $A_1$, respectively, are high. For memory address binary 10, actuation signals $A_0$ and $A'_1$ are high. For memory address binary 01, actuation signals $A_1$ and $A_1$ are high and for memory address binary 00, $A_0'$ and $A_1'$ are high.

Actuation lines 20, 22, 24 and 26 are connected to various terminals in decoding circuit 10. These connections have not been explicitly shown, but instead, are depicted by indicating the signal received at each terminal. System 14 uses current sources to pull voltage levels on the actuation lines low. System 14 also acts as a buffer between the actuation lines 20, 22, 24 and 26 and address bus 12. Actuation system 14 is known in the prior art.

Decoder 10 incorporates four substantially identical regular row decoders 100, 200, 300 and 400. Row decoders 100, 200, 300 and 400, and the balance of decoding circuit 10, are shown in a bipolar device realization of the invention. Those skilled in the art will realize that decoding circuit 10 can also be constructed using MOSFET devices. Row decoder 100 comprises a resistor 131 connecting the base of a multi-emitter transmitter 130 to a voltage source $V_0$ Resistor 132 is connected across the base to collector junction of transistor 130. The collector of transistor 130 is connected to terminal 137 upon which a select signal may be generated to select a memory row driver circuit. Transistor 130 has three emitters. Emitter 134 is connected to a cancel select transmission line 30. Emitter 135 is connected to actuation line 24 and emitter 136 is connected to actuation line 20. Accordingly, emitters 136 and 135 receive actuation signals $A_0$ and $A_1$. Transistor 130 is an otherwise conventional NPN bipolar transistor, which assumes an ON state when a minimum voltage is applied across any base to emitter junction. For voltage differences less than the transistor turn-on voltage across all of the base to emitter junctions, transistor 130 is off.

Memory row decoder 200 is similar. Resistor 231 connects a voltage source, $V_0$ to the base of transistor 230. A resistor 232 is connected across the base to collector junction of transistor 230. The collector of transistor 230 is connected to terminal 237 upon which a memory row select signal appears. Transistor 230 is a multi-emitter NPN bipolar transistor, with emitters 234, 235 and 236. Emitter 234 is connected to cancel select transmission line 30. Emitter 235 is connected to actuation line 26 to receive actuation signal $A_1'$ and emitter 236 is connected to actuation line 20 to receive actuation signal $A_0$. The presence of a sufficient potential difference between the base of transistor 230 and any one emitter 234, 235 or 236 will result in transistor 230 turning on. When transistor 230 is off, the potential on collector transistor 230 will rise to substantially $V_0$ which provides a select signal on terminal 237.

Memory row driver 300 comprises multi-emitter transistor 330. A resistor 331 connects the base of multi-emitter transistor 330 to a source of potential $V_0$. The base of transistor 330 is connected to the collector of transistor 330 by resistor 332. The collector of transistor 330 is also connected to an output terminal 337 where a memory row select signal appears. Transistor 330 is a multi-emitter NPN bipolar transistor with three emitters 334, 335 and 336. Emitter 334 is connected to cancel select line 30. Emitters 335 and 336 are connected to actuation lines 24 and 22, respectively, and thereby receive actuation signals $A_1$ and $A_0$, respectively, to determine the on/off state of the transistor.

Memory row driver 400 comprises an NPN multi-emitter bipolar transistor 430 with emitters 434, 435 and 436. Resistor 431 connects the base of transistor 430 to a source of voltage $V_0$. A resistor 432 is connected across the base to collector junction of transistor 430 and the collector of transistor 430 is connected to terminal 437 for providing a memory row select signal thereon. Emitter 434 is connected to cancel select transmission line 30. Emitters 435 and 436 are connected to actuation lines 26 and 22, respectively, for receiving actuation signals $A_1'$ and $A_0'$, respectively, to determine the on/off state of the transistor.

Any one of multi-emitter transistors 130, 230, 330, or 430 turns on if one of its emitters receives a low voltage level signal. Because each of transistors 130, 230, 330, and 430 have their emitters connected to a different combination of actuation signals, it will be apparent that for only one transistor will both emitters connected to actuation lines assume the logical 1 state for any one memory address. Accordingly, only one transistor at a time can be turned off to develop a memory row select signal on one of terminals 137, 237, 337, or 437. Terminals 137, 237, 337 and 437 provide a select signal to, for example, the base of a memory row driving transistor. Accordingly, little current is drawn from terminals 137, 237, 337 and 437 when a select signal appears thereon.

Decoding circuit 10 also includes two auxiliary row decoders 500 and 600. Row decoder 500 comprises a conventional NPN bipolar transistor 530 with single emitter 534. A resistor 531 connects the base of transistor 530 to a source of potential $V_0$. A resistor 532 is connected across the base to collector junction of transistor 530. Terminal 537 is connected to the collector of transistor 530. When transistor 530 is in the off state, the voltage appearing on terminal 537 will rise to substantially $V_0$ providing a memory row select signal on terminal 537. Transistor 530 will be in the on state when the voltage drop across the base to emitter junction exceeds a minimum turn on voltage. The potential appearing on emitter 534 is controlled by configurable selection circuit 101.

Similarly, auxiliary memory row decoder 600 comprises an NPN bipolar transistor 630 to control the potential appearing at terminal 637. A resistor 631 connects a source of potential $V_0$ to the base of transistor 630. A resistor 632 is connected across the base to collector junction of transistor 630. Transistor 630 includes a single emitter 634 which is in turn connected to configurable selection circuit 201. Again, a low emitter potential on emitter 634 will cause transistor 630 to turn on and a high emitter voltage on emitter, 634 will cause transistor 630 to turn off driving its collector voltage high and providing a memory row select signal at terminal 637.

Selection circuits 101 and 201 control the potential level appearing on emitters 534 and 634, respectively. Configurable selection circuit 101 comprises four NPN bipolar transistor switches 150, 152, 154 and 156. Transistors 150, 152, 154 and 156 are connected between emitter 534 of transistor 530 and a current source 180. The operating parameters of current source 180 determine the minimum and maximum values of $V_0$ for which the circuit will operate. The emitters of transistors 150, 152, 154 and 156 are connected to current source 180 by configuration links 160, 162, 164 and 166, respectively. The collectors of transistors 150, 152, 154 and 156 and emitter 534 are connected to a potential source $V_0$ by resistor 144. The bases of transistors 150, 152, 154 and 156 are connected to actuation lines 20, 22, 24 and 26, respectively. Accordingly, actuation signal $A_0$ appears on the base of transistor 150, $A_0'$ on the base of transistor 152, $A_1$ on the base of transistor 154 and $A_1'$ on the base of transistor 156. Transistors 150, 152, 154 and 156 turn on if the base to emitter potential drop exceeds the turn on voltage for the transistor. Selection configuration circuit 101 is unconfigured, that is all configuration links are closed. Accordingly, all of transistor switches 150, 152, 154 and 156 remain in the circuit. For any memory address, exactly two of the foregoing transistors will be on and two will be off. Resistor 144 is selected so that the desired amount of current is drawn from transistor 530. Current source 180 will draw the emitter potential level of emitter 534 to a sufficiently low level to turn transistor 530 on. Resistors 531 and 532 will act as a voltage divider to limit voltage swing at emitter 534. This increases switching speed.

Selection circuits 101 further comprise an NPN bipolar transistor 140 connected across cancel select transmission line 30 and current source 180. Transistor 140 is provided to allow a cancel select signal to be introduced to cancel select transmission line 30. A cancel select signal is a low potential level signal transmitted to emitters 134, 234, 334 and 434 to insure that transistors 130, 230, 330 and 430 are all on. Because selection configuration circuit 101 is unconfigured, transistor 140 remains off. The base of transistor 140 is connected to a source of potential $V_{ref}$ which is chosen so that any one of transistors 150, 152, 154 or 156 will turn on in response to receipt of a high actuation signal before transistor 140 turns on. In other words, $V_{ref}$ is more negative than a high actuation signal, but more positive than a low level actuation signal. Resistor 142 connects the collector of transistor 140 to a source of potential $V_0$ to maintain the potential level appearing on cancel select line 30 at $V_0$ absent transistor 140, or transistor 240, turning on.

Selection circuit 201 is substantially identical to selection circuit 101. Four NPN bipolar transistor switches 250, 252, 254 and 256 are connected at their bases to actuation lines 20, 22, 24 and 26, respectively. Configuration, links 260, 262, 264 and 266 are provided to connect emitters of transistors 250, 252, 254 and 256, respectively, to current source 280. However, as is shown in the drawing, configuration links 260 and 264 are shown as opened. Accordingly, transistors 250 and 254 have been effectively removed from the circuit. The collectors of transistors 250, 252, 254 and 256 are connected to emitter 634. A resistor 244 connects a source of potential $V_0$ to the collectors of transistors 250, 252, 254 and 256 to raise the potential level appearing on emitter 634, in the case no conduction path appears through transistors 250, 252, 254 and 256 from emitter 634 to current source 280. Current source 280 operates in the same manner as current source 180.

Should actuation signals $A_0$ and $A_1$ be high and actuation signals $A_0'$ and $A_1'$ be low, no conduction path appears from emitter 634 to current source 280. The potential level appearing on emitter 634 will rise turning transistor 630 off. A select signal appears on terminal 637. Current source 280 draws down the emitter voltage of transistor 240 until transistor 240 turns on because $V_{ref}$ coupled to the base of transistor 240, is more positive than the low level actuation signals. The potential level appearing on cancel select line 30 falls and the potential appearing on emitters 134, 234, 334 and 434 becomes low assuring that transistors 130, 230, 330 and 430 are all on. Resistor 242 performs a similar function as resistor 142 in connecting cancel select line 30 to a source of potential $V_0$ and raising the potential level on cancel select line 30 to that level should transistors 140 and 240, be off.

Typically, configuration links 160 through 166 and 260 through 266 are formed from metal or polysilicon strips deposited on the surface of an integrated circuit. They may be opened by exposure to a heat source such as laser light. Alternatively, shorted junction fuses may be employed in place of surface fuses. Typically, configuration links are opened after testing of a integrated circuit determines that the row of memory cells was not operating properly. A pattern of configuration links corresponding to the memory address location of the defective memory row is then opened in any one previously unconfigured configurable selection circuit. Opened configuration links 260 and 264 correspond to transistors 250 and 254 which in turn are actuated by high signals on actuation lines 20 and 24. Thus a logical address of 11 is indicated by the pattern of opened configuration links. Receipt by decoding circuit 10 of memory address binary 11 will result in programmable selection circuit 201 drawing substantially no current from row decoder 600 because transistors 252 and 256 are off and transistors 250 and 254 are out of the circuit. The voltage level on emitter 634 rises to $V_0$ through resistor 244. Substantially no base to emitter voltage difference is applied to transistor 630 causing a select signal to appear on terminal 637.

At the same time, current source 280 will draw the emitter of transistor 240 low. This causes transistor 240 to turn on and pull the collector of transistor 240 low, bringing the voltage on cancel select line 30 low. This disables row decoders 100, 200, 300 and 400 and, more particularly, the row decoder corresponding to memory address binary 11. Row decoder 100 corresponds to this memory address.

Receipt of address signal binary 11 by decoding circuit 10 results in an auxiliary row of memory cells being selected in lieu of a regular row of memory cells. It will be apparent to the reader that any other binary address will result in actuation of either transistor 252 or transistor 256 in selection circuit 201, resulting in driver 600 not generating a select signal on terminal 637.

Operation of decoding circuit 10 is discussed below in greater detail. Again assume memory address binary 11 has been selected. Logic 1 signals appear on address lines 21 and 23. Memory address 11 results in high signals on actuation lines 20 and 24, low signals on actuation lines 22 and 26. High actuation signal $A_0$ is coupled to emitters 136 and 236. High actuation signal $A_1$ is coupled to emitters 135 and 335. Emitters 235, 336, 436 and 435 are low and transistors 200, 300 and 400 thus all have at least one low emitter, causing transistors 200, 300 and 400 to remain on. Select signals do not appear on terminals 237, 337 and 437.

In programmable selection circuits 101 and 201, the bases of transistors 150, 250, 154 and 254 receive high signals. It may be seen that fusible links 160 and 164 corresponding to transistors 150 and 154 are not open, and transistors 150 and 154 turn on. Current source 180 will draw down the voltage level on emitter 534 through transistors 150 and 154. Transistor 530 turns on pulling terminal 537 low. Transistor 140 does not turn on.

Programmable selection circuit, 201, being configured by opening configuration links 260 and 264 responds differently. High signals occur on the bases of transistors 250 and 254. However, fusible links 260 and 264, being open, prevent transistors 250 and 254 from turning on. Transistors 252 and 256 remain off because their respective bases are coupled to actuation lines 22 and 26 which provide low signals. Accordingly, current source 280 will not draw current through programmable selection circuit 201. Current source 280 will pull down the voltage level on the emitter of transistor 240 sufficiently to bring transistor 240 into conduction. The voltage level on disable line 30 falls, pulling down the voltage level on emitters 134, 234, 334 and 434. Transistors 230, 330 and 430, already being on, remain on. However, transistor 130, which normally would be turned off by memory address 11, now turns on as the voltage level on emitter 134 falls. No select signal appears on terminal 137. Instead, row decoder 600 generates a select signal on terminal 637. Because transistors 250, 252, 254 and 256 are not conducting, the voltage level on emitter 634 will rise through resistor 244. Transistor 630 will turn off and the voltage level on terminal 637 will increase to select signal level.

Consider by way of further example, memory address binary 01 appearing on address bus 12. Actuation lines 22 and 24 will be high while actuation lines 20 and 26 are low. Accordingly, the bases of transistors 152, 154, 252 and 254 will be driven high and the transistors will go into conduction if their corresponding configuration links 162, 164, 262 and 264 are closed.

Of corresponding configuration links 162, 164, 262 and 264, only 264 is open, so transistors 152, 154 and 254 are on. Transistors 530 and 630 will have low emitter voltage levels, turning both transistors on and resulting in no select signals appearing on terminals 537 and 637.

Because current sources 180 and 280 draw current from decoders 500 and 600, cancel select transistors 140 and 240 remain off. Cancel select line 30 moves to voltage level $V_0$ assuring that emitters 134, 234, 334 and 434 are all high.

Simultaneously, the remaining emitters of row of memory cells enablers 100, 200, 300 and 400 assume the values appearing on their respective actuation lines. Accordingly, emitters 135, 335, 336 and 436 are high, the other emitters being low. Thus, of transistors 130, 230, 330 and 430, only transistor 330 receives high level signals on all of its emitters and only transistor 330 is off. The voltage level on terminal 337 rises to substantially $V_0$ and a select signal appears thereon.

Advantages of the present invention include minimizing the number of configuration links. This is accomplished by eliminating the configuration links formerly provided each regular memory row decoder. Reducing the number of configuration links reduces the processing required to configure an integrated circuit to substitute an auxiliary row of memory cells for a regular row of memory cells, and also minimizes the physical size of the integrated circuit.

A further advantage of the present invention is that select signal voltage levels, are not affected by reconfiguration of the decoder. All actuation lines in the present invention are permanently connected to a fixed number of emitters and accordingly, low actuation signals result in the same quantity of current being drawn from any given emitter coupled to the actuation line. The potential appearing as a low select signal remains within narrower bounds.

Although the present invention has been described with reference to preferred embodiments, workers skilled in the art will recognize that changes may be made in form and detail without departing from the spirit and scope of the invention.

What is claimed is:

1. A configurable decoding circuit, which comprises:
    means, for receiving various input signals and responsive thereto, and for providing differing sets of actuation signals;
    a plurality of select signal generators, each being electrically coupled to the actuation signals providing means for responding to a different unique set of actuation signals for generating a select signal on an output, terminal;
    at least a first configurable means for generating a cancel select signal and an auxiliary actuation signal in response to a selectable set of actuation signals;
    means for transmitting the cancel select signal to the plurality of select signal generators for preventing them from generating select signals; and
    an auxiliary select signal generator connected to each configurable means and responsive to an auxiliary actuation signal generated thereby for generating a select signal on an output terminal.

2. The configurable decoding circuit defined in claim 1, wherein the various input signals are logic signals corresponding to memory addresses.

3. The configurable decoding circuit defined in claim 2, wherein each set of actuation signals corresponds to a single memory address.

4. The configurable decoding circuit defined in claim 3, wherein each configurable generating means further comprises:
    a plurality of switch means, each being coupled to the actuation signals providing means for responding to a different actuation signal to control opening and closing thereof; and
    an openable link means serially connected with each switch means;
    whereby an opened link means prevents actuation of its respective switch means.

5. The configurable decoding circuit defined in claim 4, wherein each configurable generating means further comprises:
    an auxiliary actuation signal terminal;
    a source of electrical potential $V_0$ coupled by a load to the auxiliary actuation signal terminal;
    an internal common junction; and
    each of the plurality of selection switch means and configurable links being connected across the auxiliary actuation signal terminal and the internal common junction.

6. The configurable decoder circuit defined in claim 5, further comprising:
    the means for transmitting cancel select signals including transmission line connected to each select signal generator; and
    each configurable generating means further including cancel select switch means connected across the cancel select transmission line and the internal common junction and a current source connected across the internal common junction and a fixed potential level wherein the current source is oriented to draw current from the internal common junction.

7. The configurable decoding circuit defined in claim 6, wherein the selection switch means and the cancel select switch means are NPN type bipolar transistors.

8. The configurable decoding circuit defined in claim 7 wherein each configurable generation means further comprises:
    the base electrode of each NPN transistor selection switch being connected to a transmission line for receiving an actuation signal;
    the emitter electrodes of the NPN transistor selection switches being coupled by their respective openable links to the internal common junction; and
    the collector electrode of each NPN transistor selection switch being connected to the auxiliary actuation terminal.

9. The configurable decoding circuit defined in claim 8, wherein each configurable generating means further comprises:
    the base electrode of the NPN transistor cancel select switch connected to source of reference voltage $V_{REF}$;
    the collector electrode of the NPN transistor cancel select switch being connected to the cancel select signal transmission line;
    the emitter electrode of the NPN transistor cancel select switch being connected to the internal junction.

10. The configurable decoding circuit defined in claim 9, further comprising:

the source of voltage $V_0$ being coupled by a resistor to the actuation cancel transmission line;

whereby the signal appearing on the cancel select transmission line is substantially $V_0$ when all cancel select transistor switches are off and at some potential level less positive than $V_0$ if any cancel select transistor switch is on.

11. The configurable decoding circuit defined in claim 10, wherein selected openable links have been opened in a pattern corresponding to a set of actuation signals, in a given configurable means, whereby receipt of the actuation signals in the corresponding set of actuation signals fails to actuate any selection switch in the configurable means and breaks current path between the auxiliary actuation terminal and the internal common junction, whereby the potential level on the auxiliary actuation terminal rises and the potential of the common junction falls until the actuation cancel transistor switch turns on pulling down the potential level appearing on the cancel select transmission line.

12. The configurable decoding circuit defined in claim 11, wherein each auxiliary select signal generator comprises an NPN type bipolar transistor, the emitter of which is connected to an auxiliary actuation terminal.

13. The configurable decoding circuit defined in claim 12, wherein each select signal generator comprises a multi-emitter NPN type bipolar transistor wherein one emitter is connected to cancel the select transmission line.

14. The configurable decoding circuit defined in claim 13, wherein the configurable decoder circuit is formed in an integrated circuit.

15. A configurable decoding circuit for use in an integrated circuit memory store, the memory store including a plurality of sections of memory cells actuated by receipt of selection signals directed thereto, the configurable decoder circuit comprising:

a plurality of actuation lines for transmitting actuation signals;

means for providing actuation signals on each of a plurality of nonexclusive subsets of the plurality of actuation lines;

a plurality of memory section decoders, each memory section decoder being connected to a different subset of the plurality of actuation lines and further being responsive to actuation signals being present on all of the actuation lines of the subset for generating a memory section select signal;

at least a first memory section auxiliary decoder; and at least a first configurable selection circuit connected to the at least first memory section auxiliary decoder, the plurality of memory section decoders and the plurality of actuation lines, and being responsive to actuation signals on all of a selectable subset of the actuation lines for preventing any of the memory section decoders from generating a selection signal and for actuating the at least first memory section auxiliary decoder for generating a select signal.

* * * * *